(12) United States Patent
Yu

(10) Patent No.: US 6,285,309 B1
(45) Date of Patent: Sep. 4, 2001

(54) NESTED PIPELINED ANALOG-TO-DIGITAL CONVERTER

(75) Inventor: Paul C. Yu, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/395,846

(22) Filed: Sep. 14, 1999

(51) Int. Cl.$^7$ .............................. H03M 1/38; H03M 1/34
(52) U.S. Cl. .................................... 341/161; 341/163
(58) Field of Search .................................. 341/161, 172, 341/158, 156, 162, 118, 120, 131, 139, 143, 155, 163

(56) References Cited

U.S. PATENT DOCUMENTS 4,894,657 * 1/1990 Hwang et al. ..................... 341/158
5,771,012 * 6/1998 Shu et al. ........................... 341/118
6,166,675 * 12/2000 Bright ................................ 341/162

* cited by examiner

Primary Examiner—Patrick Wamsley
(74) Attorney, Agent, or Firm—J. Dennis Moore; W. James Brady, III; Frederick J. Telecky, Jr.

(57) ABSTRACT

A multi-stage analog-to-digital converter ("ADC") for converting an analog input signal to a series of digital values, each having a first plurality of bits, representing the voltage levels of the analog input signal at a corresponding series of sample times. The ADC includes a plurality of analog-to-digital converter stages connected serially in pipeline configuration. One or more of such stages includes an analog-to-digital subconverter, providing a second plurality of bits of the digital value, where the second plurality is smaller than the first plurality, the analog-to-digital subconverter including a plurality of analog-to-digital subconverter substages connected serially in pipeline configuration. Each such subconverter substages provides one or more bits of the second plurality of bits. The nested approach of this invention allows an increased resolution in the first stage of the pipeline which has the benefit of avoidance of capacitor trimming, a more efficient use of the comparators and other circuit components, a relaxation in the comparator offset requirements, and satisfy kT/C noise requirements more easily in submicron low-voltage ADC's.

5 Claims, 7 Drawing Sheets

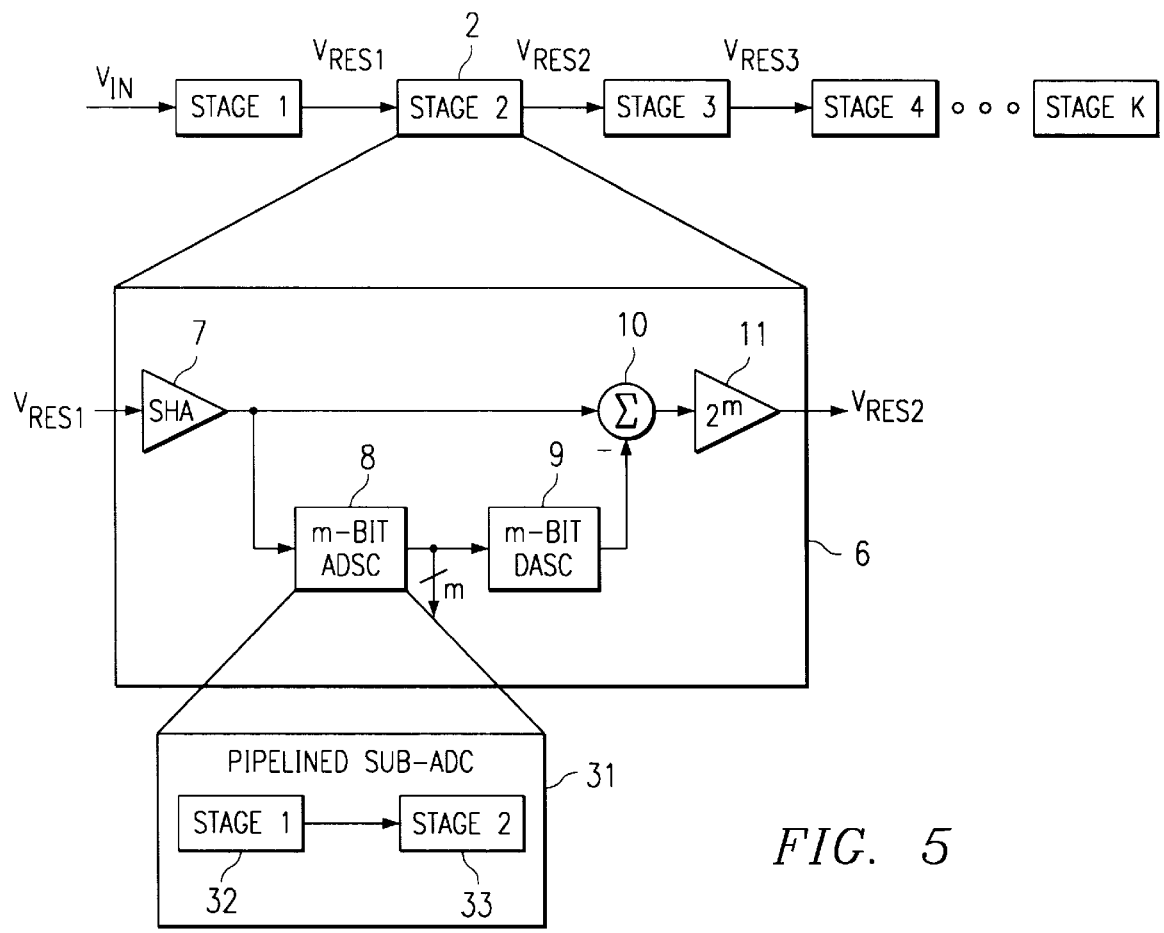
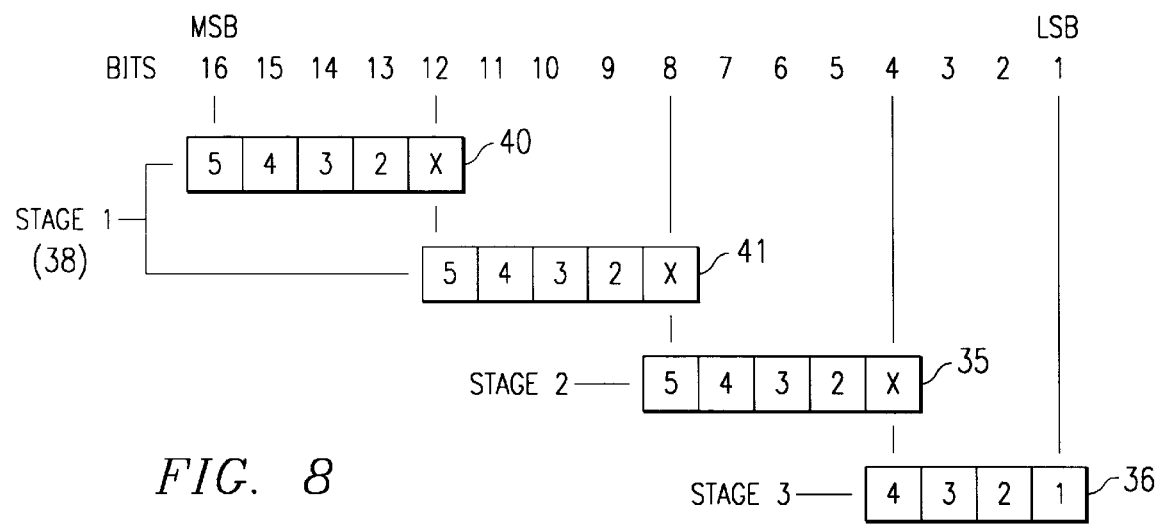
FIG. 5
FIG. 8

US 6,285,309 B1

NESTED PIPELINED ANALOG-TO-DIGITAL CONVERTER

BACKGROUND OF THE INVENTION

1. Field of the Invention

This invention relates generally to analog-to-digital converter (ADC) circuitry, primarily of the pipelined architecture, and more specifically to a new nested pipelined architecture for this type circuit.

2. Brief Description of the Prior Art

A block diagram of the architecture for a conventional multi-bit per stage pipelined Analog-to-Digital Converter (ADC) is shown in FIG. 1. The total number of bits is broken into K stages 1–5, sometimes with an equal number of bits per stage but not necessarily so. An analog input voltage signal $V_{IN}$ is applied to the first stage 1, with the output of each stage k being coupled to the following stage k+1 in a pipeline fashion. Each stage is comprised of the circuitry shown in the block diagram in blow-up 6 of exemplary stage 2.

In operation, the analog input voltage signal $V_{IN}$ is first sampled by a Sample-and-Hold Amplifier (SHA) 7. This sampled signal is then quantized by a multi-bit Analog-to-Digital sub-Converter (ADSC) 8, converted back to an analog voltage using a Digital-to-Analog sub-Converter (DASC) 9, and then subtracted from the sampled input by a difference circuit 10. For each stage k, the resulting difference signal, known as the residue, is then multiplied by a factor of $2^m$, where m is the number of bits resolved in the stage, by an amplifier 11 to bring the signal back to full scale value. The amplified residue signal $V_{RESk}$ is then presented to the next stage k+1 of the pipeline where a similar set of operations is performed.

At each stage a digital output for the m-bits is present at the output of the ADSC 8. After the signal propagates through the K stages, a digital representation of the input signal $V_{IN}$ is provided by the concatenation of the multi-bit digital outputs from the ADSC 8 of each stage k. In a typical design, the ADSC 8 is a flash converter, while the DASC 9 is a switched capacitor multiplying DAC.

It is commonly known in the art that increasing the number of bits per stage in a pipelined ADC relaxes the capacitor matching requirements and enhances the achievable resolution of the overall ADC, but it also increases the number of comparators and resistors in the ADSC 8 circuit as well as the comparator offset voltage requirements. In a conventional ADC, additional circuitry and power must be utilized to reduce this offset voltage to an acceptable level. Also, the additional number of comparators required when the number of bits is increased, places more load on the operational amplifier, resulting in slower operation of the overall circuitry.

FIG. 2a shows a 1-bit/stage implementation for a typical switched capacitor circuit which uses the same components in both sampling and amplification phases. The circuit is comprised of capacitors C1 and C2 (12 & 13), an operational amplifier 14, a comparator 15, and switches 16–19, which are controlled by the alternating phases of clock signals. Under control of the clock signals, the positions of the switches 16–19 alternate between a sampling configuration and an amplification configuration, as illustrated by the clock cycles shown in the signal timing diagram of FIG. 2b. In FIG. 2a, the switch positions during the sampling phase are shown by a solid line, while the switch positions during the amplification phase are shown by a dashed line.

FIGS. 3a and 3b show a typical implementation of a stage k of a pipelined ADC which includes a sampling phase, as shown in FIG. 3a, and an amplification phase, as shown in FIG. 3b, These circuits are based on the circuit shown in FIG. 2a, and are configured using the switches discussed above in connection with FIGS. 2a and 2b. For simplicity, this discussion in limited to 1-bit/stage. The voltage of the input signal $V_{IN}$, or, alternatively, $V_{RESk-1}$, is first sampled on capacitors C1 (12) and C2 (13) during the sampling phase as shown in FIG. 3a. A single comparator 15 is used to determine if $V_{IN}$ is greater than or less than half of the full scale voltage, which in this case is 0 volts. For this one bit per stage example, comparator 15 is used as the ADSC, although in multi-bit/stage implementations the ADSC is typically a flash converter. Depending on the comparator 15 decision, d, the bottom plate of C2 (13) is connected to either $+V_{REF}$ or $-V_{REF}$ during the amplification phase, as shown in the following Table 1:

TABLE 1

| $V_{IN}$ | d | Select |
|---|---|---|
| <0 | 0 | $-V_{REF}$ |
| >0 | 1 | $+V_{REF}$ |

At the same time, the bottom plate of C1 (12) is connected to the output of operational amplifier 14, as shown in FIG. 3b, Since the input of operational amplifier 14 is a high impedance node, the charge stored at the instant when the sampling occurs remains unchanged during the amplification phase. By applying this charge conservation principle, it can be shown that the output $V_{RESk}$ of the operational amplifier 14, also known as the residue, is given by:

$$V_{RESk} = \left(\frac{C1+C2}{C1}\right)*V_{IN} + \left(\frac{C2}{C1}\right)*V_{REF}, \text{ if } d=0, \text{ i.e., } V_{IN} \leq 0$$

$$V_{RESk} = \left(\frac{C1+C2}{C1}\right)*V_{IN} - \left(\frac{C2}{C1}\right)*V_{REF}, \text{ if } d=1, \text{ i.e., } V_{IN} > 0.$$

In the case where C1 and C2 are perfectly matched, these equations reduce to:

$V_{RESk}=2*V_{IN}+V_{REF}$, if d=0, i.e., $V_{IN}<0$ $V_{RESk}=2*V_{IN}-V_{REF}$, if d=1, i.e., $V_{IN}>0$.

FIGS. 4a and 4b show the typical circuits for a multi-bit/stage implementation of a pipelined ADC. The circuits look much like the one bit per stage circuits, discussed above, but with additional components. FIGS. 4a and 4b show multi-bit/stage implementations for the sampling and amplification circuitry, respectively. These circuits require $2^m$ capacitors; i.e., for the two bit per stage example shown there are $2^2=4$ capacitors 12–13 and 20–21. Also, for this two bit per stage circuit the ADSC is a two bit flash converter 22. FIG. 4c is the circuit for a multi-bit/stage ADSC circuit 22. The circuit consists of a stack of $2^m$ resistors 23–26, $2^m-1$ comparators 27–29, and some encoding logic circuitry 30 to provide the digital output. Although the flash converter is fast, it requires a considerable amount of circuitry when m is large. Additional drawbacks are that the hardware, power, and component area all grow exponentially with the number of bits and the circuit requires precision comparators and resistors.

Typically, digital error correction is used to overcome the effects of off-set voltage in the comparators used in the ADSC. With digital error correction the amplitude of the $V_{IN}$ voltage is attenuated by a factor of 2 to ensure that the operational amplifiers do not saturate. Also, the digital output from the ADSC must be multiplied by two, but this is easily accomplished by shifting the digital word one bit to the left. This shift does cause a one-bit overlap in the concatenated word from the two stages which somewhat reduces the efficiency in parts count in multi-bit per stage implementations.

In the past, single-bit per stage pipelined ADCs have been used because of their simplicity but with today's requirements for twelve to sixteen bit resolution in applications such as digital signal processing (DSP) and others, multi-bit/stage implementations are often required. The multi-bit/stage architecture has relaxed component matching requirements. However, because of increased complexity in the ADSC, current pipelined ADC implementations are limited to about five bits per stage.

Accordingly, it is an object of the present invention to provide a pipelined ADC architecture allowing implementation beyond five bits. It is another object of the present invention to provide a pipelined ADC having a more efficient use of constituent circuit components, such as comparators, capacitors and resistors. It is a still further object of the present invention to provide a pipelined ADC architecture that permits relaxing the capacitor matching requirements in the circuits thereof.

SUMMARY OF THE INVENTION

The present invention provides a multi-stage analog-to-digital converter ("ADC") for converting an analog input signal to a series of digital values, each having a first plurality of bits, representing the voltage levels of the analog input signal at a corresponding series of sample times. The ADC includes a plurality of analog-to-digital converter stages connected serially in pipeline configuration. One or more of such stages includes a sample and hold amplifier, receiving an input signal, and holding for a predetermined period of time a voltage corresponding to the voltage levels of the input signal at the series of sample times, the first of the stages receiving the analog input signal, and subsequent stages in the pipeline receiving the output of the immediately preceding stage. Such stage or stages also include an analog-to-digital subconverter, providing a second plurality of bits of the digital value, where the second plurality is smaller than the first plurality, the analog-to-digital subconverter including a plurality of analog-to-digital subconverter substages connected serially in pipeline configuration. Each of such subconverter substages provides one or more bits of the second plurality of bits. Also included in such stage or stages are a digital-to-analog subconverter, converting the second plurality of bits to an analog value, and a difference circuit subtracting the intermediate analog value from the input signal, and providing the difference as a residue signal to the next one of the analog-to-digital converter stages in the pipeline. The nested approach of this invention allows an increased resolution in the first stage of the pipeline which has the benefit of avoidance of capacitor trimming, a more efficient use of the comparators and other circuit components, a relaxation in the comparator offset requirements, and satisfy kT/C noise requirements more easily in submicron low-voltage ADC's.

This invention allows considerable relaxation of the parts count and comparator precision in an ADSC by replacing a flash architecture with another pipelined ADSC substage. Since within the ADSC substage another pipelined ADSC is used, this architecture is termed a nested pipelined ADC. With the trend for pipelined ADCs moving towards higher resolution/stage, where the parts count grows exponentially with the number of bits/stage, this nested architecture provides considerable relief in the number of comparators, capacitors, and resistors required and in the precision of the comparators. For example, in a nine bit ADC with seven bit capacitor matching requirements, the number of comparators can reduce from 510 for a conventional flash ADSC to 60 for a two level nested ADSC. In addition, the number of resistors required for the flash and nested ADSCs can reduce from 512 to 32, respectively. Further, there can be a reduction in the amount of area required to fabricate a comparator (without preamp) of 2048:1 and even with a two-stage pre-amp an area savings of 24:1 can be realized. Another problem often encountered in conventional pipelined ADCs is that of kT/C noise. With the nested architecture of the present invention, more bits can be placed in the first stage and therefore the kT/C requirement can be satisfied more easily.

Further, the resolution of the first stage can be increased by using the nested pipeline architecture of this patent. This, in turn, can relax the capacitor mismatch problem encountered in pipeline ADCs. Since the nested approach is not limited to the typical five bits per stage of the flash approach, the first stage can have a higher number of bits, so that the requirements for the remaining stages can be considerably relaxed and as a result, handled by more conventional approaches. If for example, a fourteen bit ADC is built using 1 bit/stage, the second stage will still need thirteen bits of accuracy, but if the first stage has nine bits then the second stage will only require five bits of accuracy. In this case the nine bits of the first stage could be replaced with two five bit sub-stages which requires sixty comparators, or with four three bit sub-stages which requires twenty four comparators, or with eight two bit sub-stages which requires only sixteen comparators. Advantages for using the nested pipeline architecture include:

1) more efficient use of comparators
2) relaxed comparator offset requirements
3) leverage of existing design techniques for pipelined ADC's.

Other advantages of the nested pipelined ADC approach in general include:

1) simplicity; no trimming or calibration of capacitors
2) easily satisfies the kT/C noise requirements in submicron ADCs
3) fewer operational amplifiers, therefore more efficient
4) better spurious free dynamic range (SFDR)

BRIEF DESCRIPTION OF THE DRAWINGS

FIG. 5 is a block diagram for the nested pipelined ADC of this invention;

FIG. 8 illustrates the overlap between stages used in the digital error correction process in a pipelined ADC;

DESCRIPTION OF THE PREFERRED EMBODIMENTS

FIG. 5 shows a block diagram of the nested pipelined ADC of a preferred embodiment of the present invention, where the circuitry of a pipelined stage 6 is based on that of a conventional pipeline approach. However, in the preferred embodiment, instead of using a flash architecture for the ADSC 8 which is limited to approximately five bits per stage resolution, the ADSC is replaced with another pipelined ADSC 31. I call this a nested pipelined ADC since within the pipelined stage 6 another two stage pipelined ADSC 31 is used. This approach can be carried down to additional levels by replacing the nested ADSCs within stage 1 (32) and stage 2 (33) in the ADSC 31 with additional nested pipelined ADSCs, and so on down to two bits per stage, if so desired. However, there is usually a practical limit to the number of levels necessary to achieve an optimum solution for the trade-off between fewer parts and somewhat lower speed, although the speed issue usually is easily overcome by the much simpler circuit. Costly trimming of the capacitors for high accuracy matching can be avoided by using the nested pipeline approach to resolve more bits in the first stage.

Figure 1:
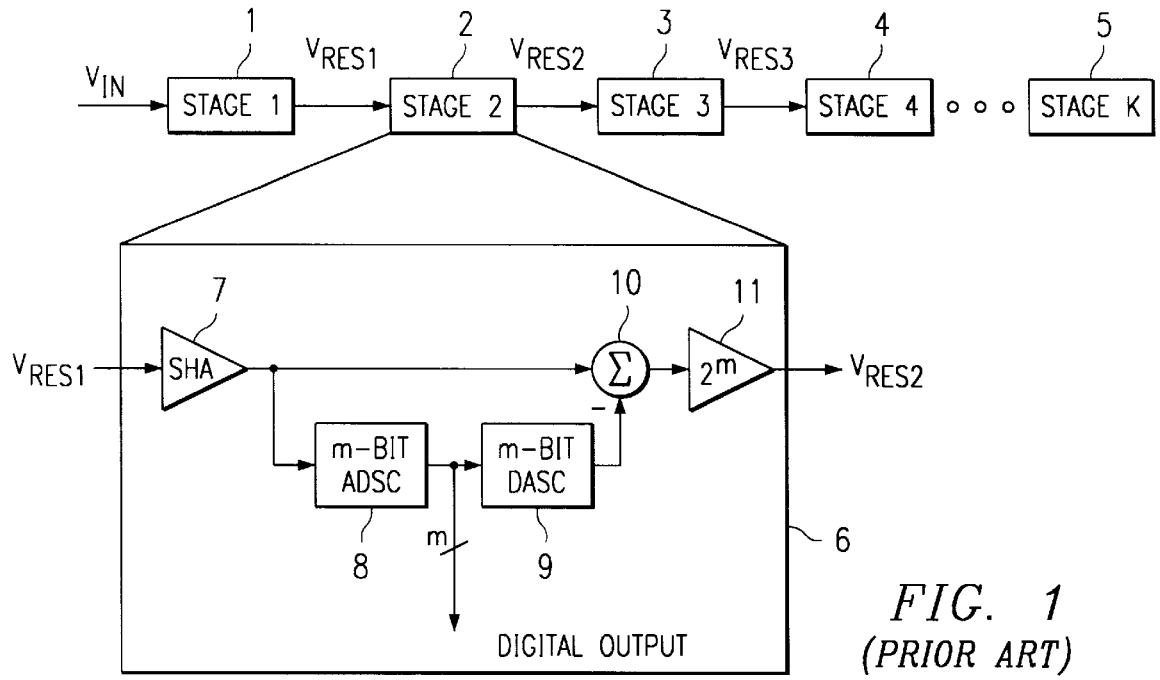
FIG. 1 is a block diagram for a conventional, prior art pipelined ADC.
Figure 2A:
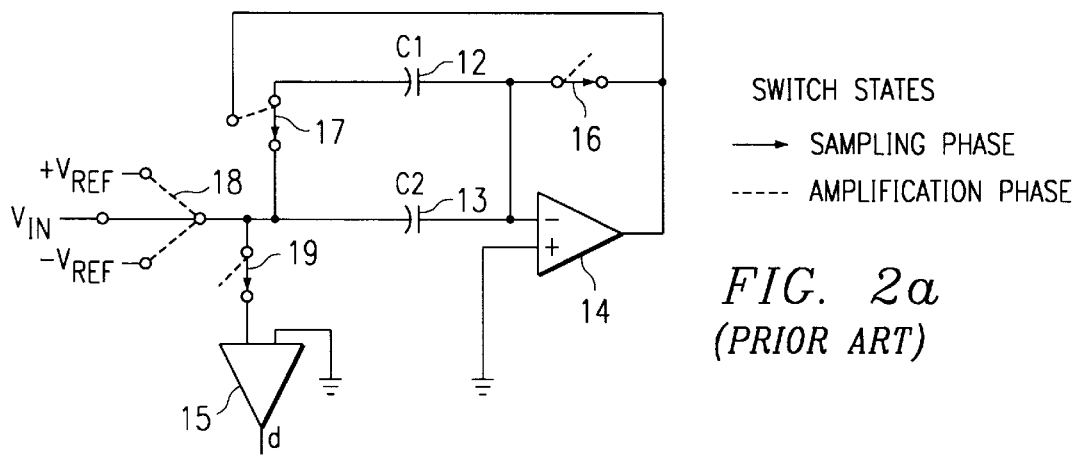
FIG. 2 is a block diagram and clock cycle for a prior art 1-bit/stage switched capacitor circuit.
Figure 2B:
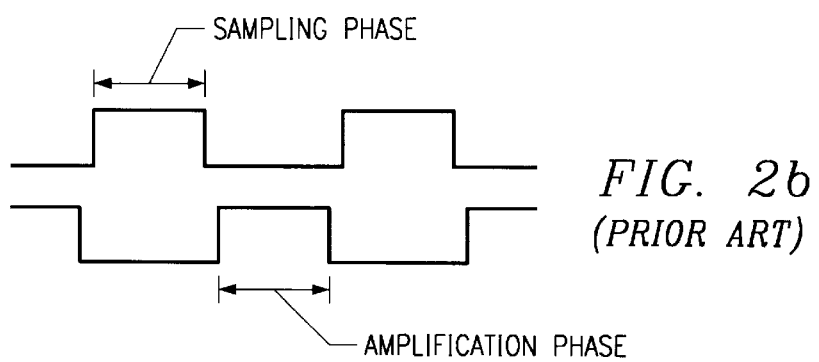
Figure 3A:
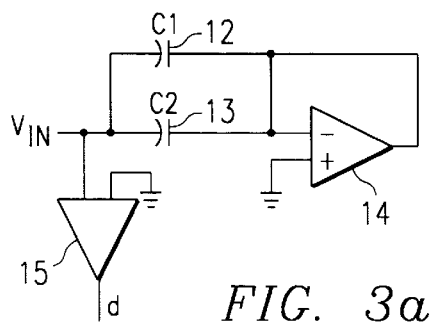
FIG. 3a is a block diagram for prior art sampling phase circuitry using a switched capacitor technique.
Figure 3B:
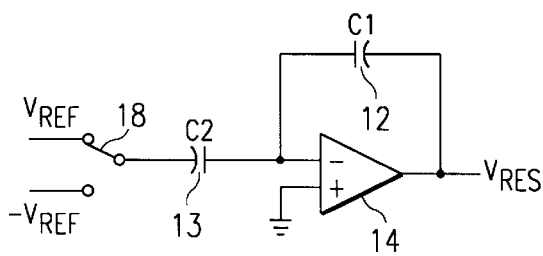
FIG. 3b is a block diagram for prior art amplification phase circuitry using a switched capacitor multiplying digital-to-analog converter.
Figure 4A:
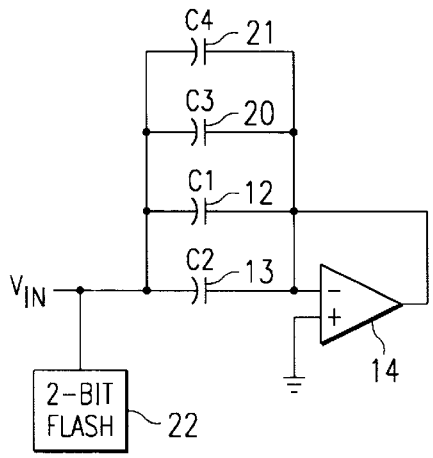
FIG. 4a is a schematic for a prior art two bit/stage sampling circuit of an ADSC.
Figure 4B:
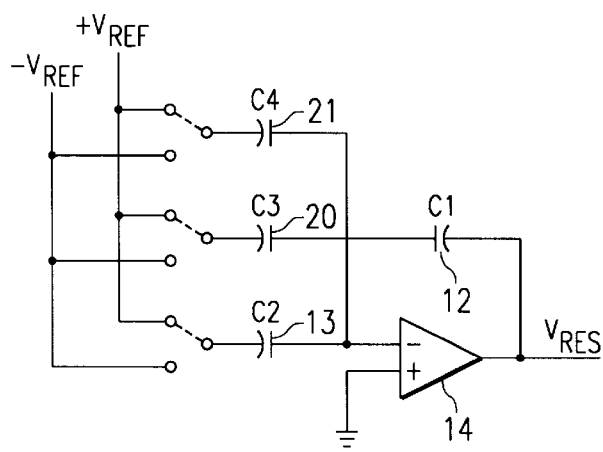
FIG. 4b is a schematic for a prior art two bit/stage amplification circuit of a ADSC.
Figure 4C:
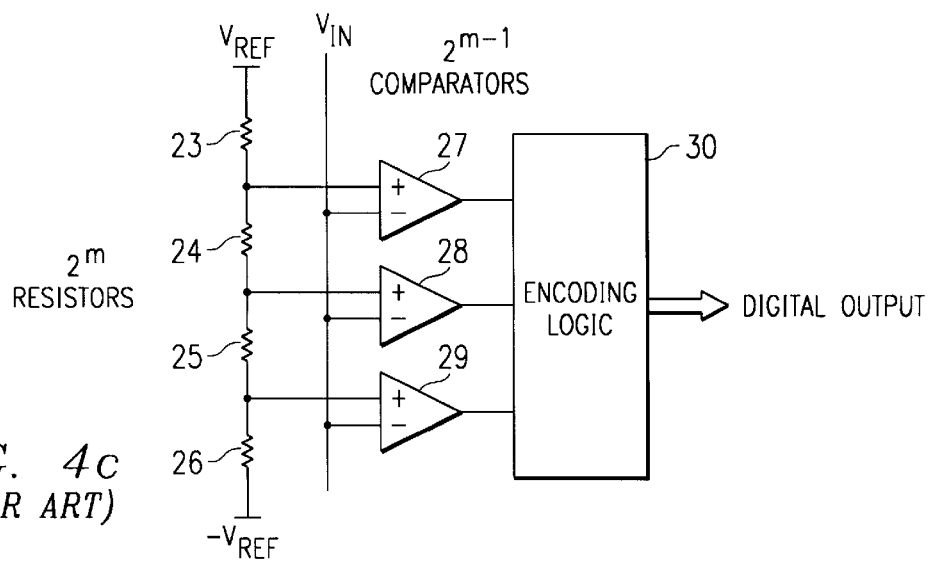
FIG. 4c is a schematic for a prior art two bit/stage flash converter.
Figure 6:
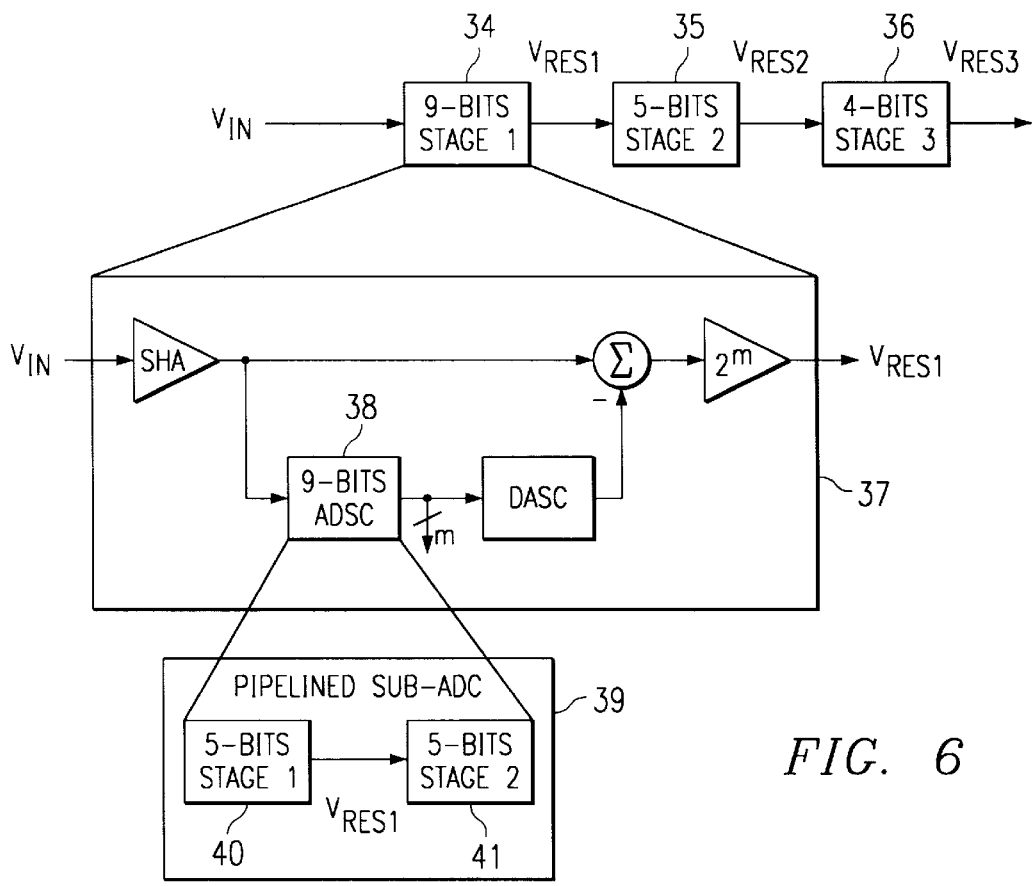
FIG. 6 shows an example of a sixteen bit nested pipeline ADC.

FIG. 6 shows an example of a sixteen bit nested pipeline ADC. The circuit is comprised of a nine bit stage 1 (34), a five bit stage 2 (35), and a four bit stage 3 (36). The extra two bits (9+5+4=18) allow for a one bit overlap between stages to perform digital error correction used to address the comparator offset issue discussed earlier in the prior art. Notice that stage 2 (35) and stage 3 (36) could use conventional pipelined ADCs, since they are both five bits or less, within the practical range of conventional flash converters.

An important consideration is for the first stage to handle as many bits as practical to relieve the capacitor matching requirements on the following stages. In this case the ADSC 38 is replaced with a two stage pipelined ADC 39 which is comprised of a five bit stage 1 (40) and a five bit stage 2 (41). Again, the combined ten bits allows for a one bit overlap between stages 40–41 to compensate for the digital error correction, thereby resulting in nine bits. In this circuit the number of comparators is $2 \times 2^m - 1$, but the number of resistors required is only $2^m$ since they can be shared between the two stages.

The following Table 2 shows the advantages in using the nested pipeline approach in stage 1 (38) of this example.

TABLE 2

Requirements for nine bit first stage in sixteen bit pipelined ADC
Nested Pipeline ADC vs. Conventional ADC

|  | Number of Comparators | Number of Resistors | Comparator Precision |
|---|---|---|---|
| Conventional 9-bit Flash ADSC | $2^9 - 1 - 1 = 510$ | $2^9 = 512$ | 1/512 |
| Two level 9-bit Nested ADSC | $2 \times (2^5 - 1 - 1) = 60*$ | $2^5 = 32$ (shared resistors) | 1/32 |

Note: *The extra −1 is for the overlap bit between stages.

Figure 7:
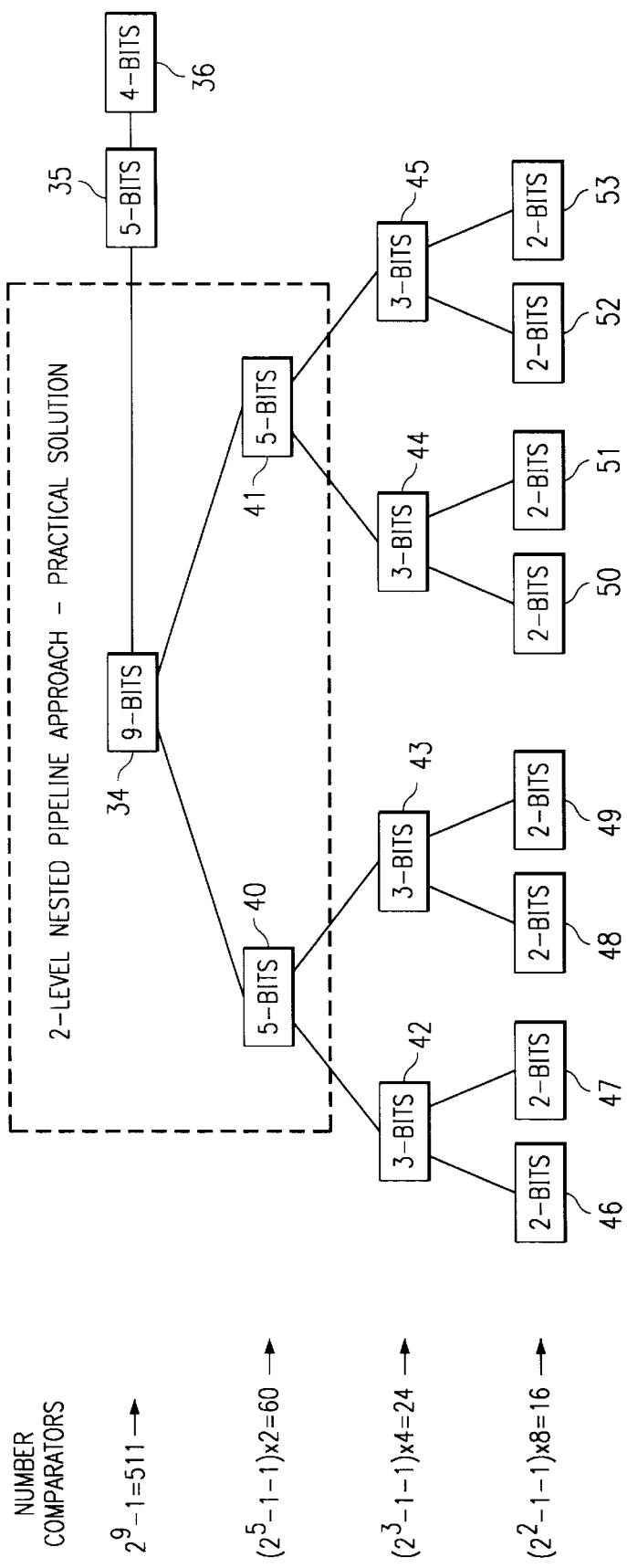
FIG. 7 shows the replacement process in the nested pipelined ADC down to the 2 bits/stage level.

FIG. 7 illustrates how the nested pipeline technique can be carried to lower levels. This process can be carried down to two bits. In practice, this level is often referred to as 1.5 bits. This shows the earlier example of FIG. 6 where the nine bit stage 1 (38) is replaced by two five bit stages 40–41 to reduce the number of comparators from 510 to 60. This nested approach can be carried to third and fourth levels where the five bit stages 40–41 are replaced with two three bit stages 42–43 and 44–45, respectively, and then each of these three bit stages 42–45 are replaced with two two bit stages, i.e., 46–47, 48–49, 50–51, and 52–53, respectively. In each case there is one extra bit to allow for the overlap to compensate for digital error correction.

As shown, there is a significant drop in the number of comparators required, from 510 to 60, by using a two level nested approach. By adding third and fourth levels the number of comparators required drops to twenty four and sixteen respectively. In this example, since savings in parts is not nearly as dramatic after the second level, a two level nested approach might be a good practical choice.

FIG. 8 illustrates the one bit overlap between stages needed to compensate for the digital error correction. This shows how the nine bits of stage 1 (38) are replaced with two five bit stages 40 and 41 and how these stages 40 and 41 are concatenated together with the five bit stage 35 and four bit stage 36 with one bit overlaps to form the sixteen bit digital word at the digital output.

Figure 9:
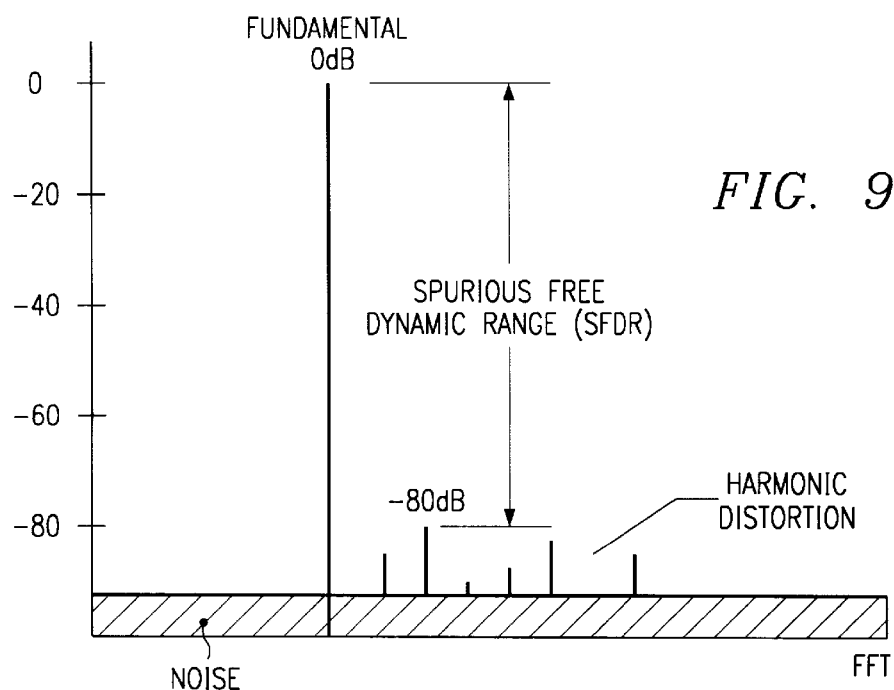
FIG. 9 illustrates the spurious free dynamic range (SFDR) for a pipelined ADC.

The nested pipeline ADC has excellent spurious free dynamic range (SFDR) as shown in FIG. 9. This drawing illustrates SFDR with a Fast Fourier Transform (FFT) plot. In this example with the harmonic distortion peaks rising out of the noise as high as the −80 dB level, the SFDR, which is the difference between the fundamental level (0 dB) and the highest harmonic distortion peak level (−80) dB, is on the order of 80 dB.

Figure 10:
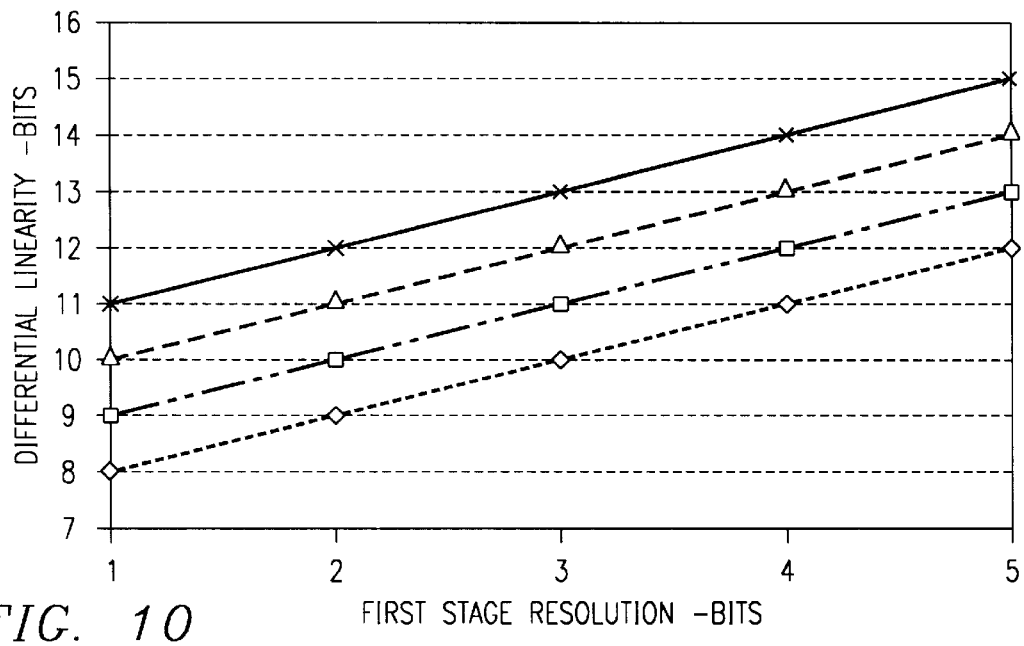
FIG. 10 shows how adding additional bits in the first stage relaxes the capacitor matching requirements in a pipelined ADC.

As stated earlier, it is well known that the capacitor matching requirements are relaxed as the number of bits in the ADC is increased. FIG. 10 is a plot showing this relationship where the differential linearity (DNL) is plotted against the first stage resolution, with the parameters measured in bits. This data shows results for capacitors which are fabricated in the same local area of a wafer. As shown, for each additional bit in the first stage, there is approximately a one bit reduction in the capacitor matching requirement for a given DNL specification.

Figure 11A:
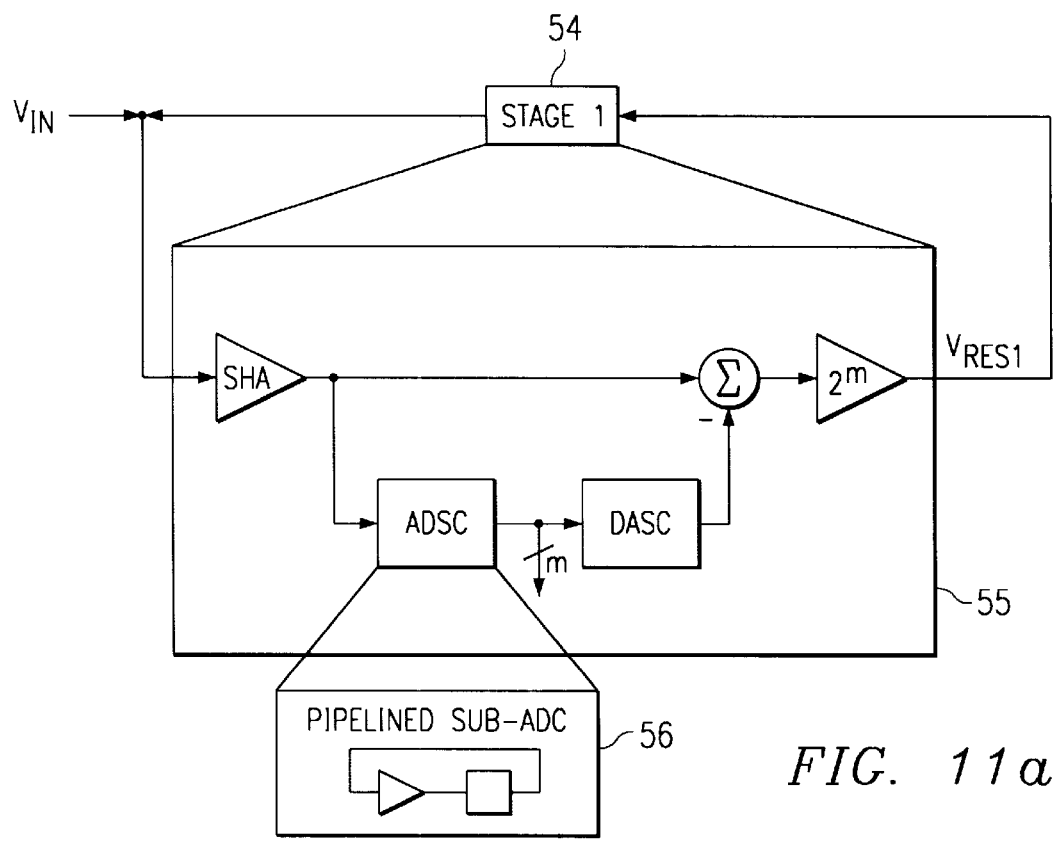
FIG. 11a is the block diagram for nested algorithmic ADC architecture.
Figure 11B:
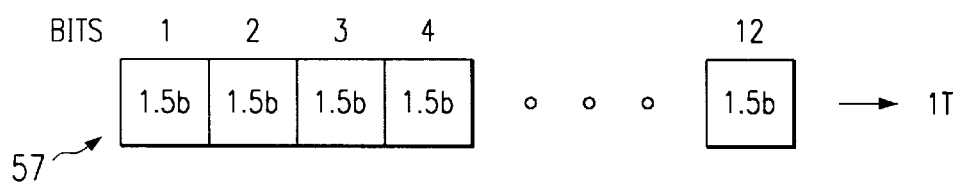
FIG. 11b illustrates the impact on circuit speed by using the nested approach in an algorithmic ADC.
Figure 11B:
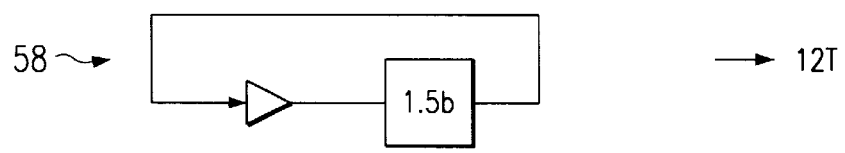
Figure 11B:
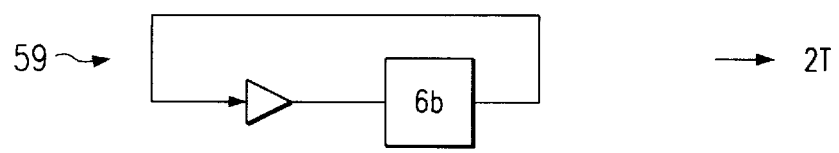

The nested approach of this patent is not limited to use with a pipeline architecture, but can be used with other architectures as well. FIG. 11a shows the nested architecture used in an algorithmic ADC. In this case there is only one stage 54 which is comprised of the circuitry of block 55. The approach here is to replace the ADSC with the nested pipelined ADC 56 and then circulate the VRES signal around the loop a number of times. The total number of bits resolved is K * m, where K is the number of times $V_{RES}$ is circulated around the loop and m is the bits resolved per clock cycle. There is a large savings in chip area using this approach, but at the expense of speed, as illustrated in FIG. 11b.

Assuming that a twelve bit ADC 57 having one bit per stage requires one time period (1T) to complete an operation, the same function could be accomplished with much less circuit area using a conventional algorithmic ADC 58, but at a twelve times (12T) slower rate. A preferred approach is to use a two level nested architecture to implement the ADC. This results in somewhat more components, requiring more chip area, but with only a two time (2T) cost in speed.

Figure 12:
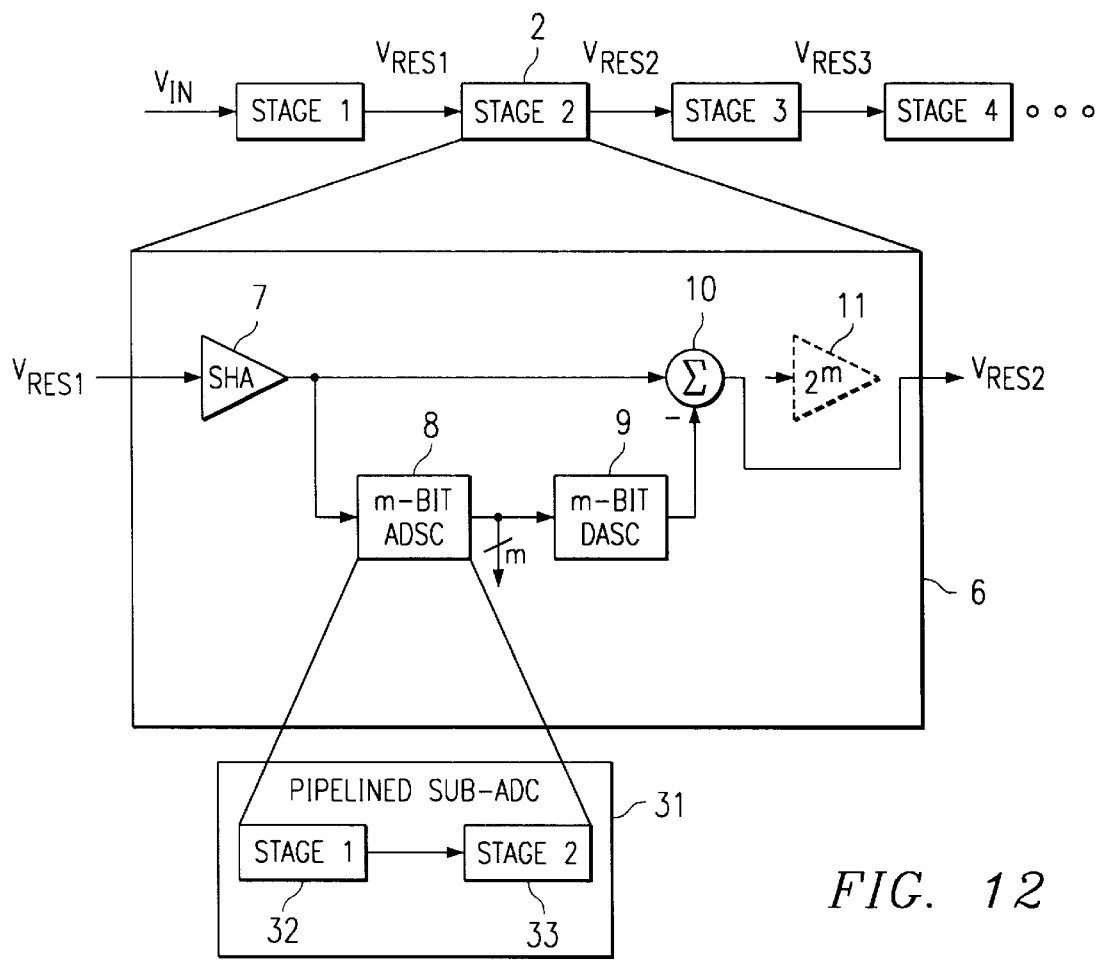
FIG. 12 is the block diagram for a nested multi-step pipelined ADC.

Another architecture which can benefit from the nested ADC architecture, called multi-step or sub-ranging ADC, is shown in FIG. 12. The difference between this circuit and the conventional pipelined ADC circuit is that the multiplying amplifier 11 is omitted, as shown by the dashed line element 11 in FIG. 12. This approach carries the residue from stage to stage without amplifying the signal back to its full scale value. All the advantages of the nested sub-pipelined ADSC can be achieved with this approach as well.

The nested pipelined ADC overcomes the problem of capacitor mismatch found in most conventional pipelined ADCs. This is accomplished by increasing the number of bits, and thus the resolution, of the first stage. Some of the benefits of the nested pipeline approach are:

1) more efficient use of comparators.
2) relaxed comparator offset requirements.
3) leveraging of existing design techniques on pipelined ADC's.
4) simplicity; no trimming or calibration of capacitors necessary.
5) easily satisfies the kT/C noise requirements for sub-micron ADC's.

The nested pipelined ADC architecture has many potential uses. However, applications where it has immediate advantages include, but are not limited to:

1) ADSL high speed MODEMS: 14 bits, 6 Ms/S.
2) Cellular base station: 12 bits, 50 Ms/S.
3) CCD Scanners: 8–12 bits, 1–10 Ms/S.
4) Ultra sound imaging: 10–12 bits, 40 Ms/S.

Although the present invention and its advantages have been described in detail, it should be understood that various changes, substitutions and alterations can be made herein without departing from the spirit and scope of the invention as defined by the appended claims.

What is claimed is:

1. A multi-stage analog-to-digital converter for converting an analog input signal to a series of digital values, each having a first plurality of bits, representing the voltage levels of said analog input signal at a corresponding series of sample times, comprising:
    a plurality of analog-to-digital converter stages connected serially in pipeline configuration, one or more of such stages comprising,
        a sample and hold amplifier, receiving an input signal, and holding for a predetermined period of time a voltage corresponding to the voltage levels of said input signal at said series of sample times, the first of said stages receiving said analog input signal, and subsequent stages in said pipeline receiving the output of the immediately preceding stage,
        an analog-to-digital subconverter, providing a second plurality of bits of said digital value, where said second plurality is smaller than said first plurality, said analog-to-digital subconverter being comprised of a plurality of analog-to-digital subconverter substages connected serially in pipeline configuration, each such subconverter substages providing one or more bits of said second plurality of bits,
        a digital-to-analog subconverter, converting said second plurality of bits to an analog value, and
        a difference circuit subtracting said intermediate analog value from said input signal, and providing the difference as a residue signal to the next one of said analog-to-digital converter stages in the pipeline.

2. A multi-stage analog-to-digital converter in accordance with claim 1, wherein one or more of said analog-to-digital converter stages in said pipeline further comprises an amplifier connected to the output of said difference circuit, and amplifying said residue signal and providing said amplified residue signal as an output of said stage.

3. A multi-stage analog-to-digital converter in accordance with claim 1, wherein at least one of said a plurality of analog-to-digital subconverter substages, providing a third plurality of bits, being fewer than said second plurality of bits, is comprised of a plurality of analog-to-digital subconverter substages connected serially in pipeline configuration, each such subconverter substages providing one or more bits of said third plurality of bits.

4. A multi-stage analog-to-digital converter in accordance with claim 1, wherein the first of said plurality of analog-to-digital converter stages provides more of said first plurality of bits than subsequent stages in said pipeline.

5. A multi-stage analog-to-digital converter for converting an analog input signal to a series of digital values, each having a first plurality of bits, representing the voltage levels of said analog input signal at a corresponding series of sample times, comprising:
    a sample-and-hold amplifier, receiving an input signal, and holding for a predetermined period of time a voltage corresponding to the voltage levels of said input signal at said series of sample times;
    an analog-to-digital subconverter, providing a second plurality of bits of said digital value, where said second plurality is smaller than said first plurality, said analog-to-digital subconverter being comprised of a plurality of analog-to-digital subconverter substages connected serially in pipeline configuration, each such subconverter substages providing one or more bits of said second plurality of bits;
    a digital-to-analog subconverter, converting said second plurality of bits to an analog value;
    a difference circuit subtracting said intermediate analog value from said input signal, and providing the difference as a residue signal to the next one of said analog-to-digital converter stages in the pipeline; and
    a switching node for providing said residue signal to the input of said sample-and-hold amplifier in recirculating manner so as to effect a plurality of stages.

* * * * *